United States Patent
Ito et al.

(10) Patent No.: US 6,624,044 B2
(45) Date of Patent: Sep. 23, 2003

(54) METHOD FOR MANUFACTURING SEMICONDUCTOR DEVICE HAVING TRENCH FILLED WITH POLYSILICON

(75) Inventors: Hiroyasu Ito, Nagoya (JP); Takafumi Arakawa, Kariya (JP); Masatoshi Kato, Aichi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/852,690

(22) Filed: May 11, 2001

(65) Prior Publication Data

US 2001/0046762 A1 Nov. 29, 2001

(30) Foreign Application Priority Data

May 16, 2000 (JP) ........................................ 2000-143303

(51) Int. Cl.[7] .............................................. H01L 21/76
(52) U.S. Cl. .................... 438/425; 438/431; 438/239; 438/404
(58) Field of Search ................................ 438/431, 437, 438/239, 387, 404, 425, 692, 699

(56) References Cited

U.S. PATENT DOCUMENTS

| | | | | |
|---|---|---|---|---|
| 4,415,383 A | * | 11/1983 | Naem et al. | 148/187 |
| 4,554,728 A | * | 11/1985 | Shepard | 29/576 W |
| 4,810,669 A | * | 3/1989 | Kobayashi | 437/67 |
| 5,099,304 A | * | 3/1992 | Takemura et al. | 357/49 |
| 5,346,584 A | * | 9/1994 | Nasr et al. | 156/636 |
| 5,502,008 A | * | 3/1996 | Hayakawa et al. | 437/225 |
| 5,783,491 A | | 7/1998 | Nakamura et al. | |
| 5,872,045 A | * | 2/1999 | Lou et al. | 438/432 |
| 5,976,982 A | * | 11/1999 | Levy et al. | 438/692 |
| 6,001,706 A | * | 12/1999 | Tan et al. | 438/424 |
| 6,030,897 A | * | 2/2000 | Deconinck | 438/691 |
| 6,191,003 B1 | * | 2/2001 | Lin et al. | 438/431 |
| 6,322,600 B1 | * | 11/2001 | Brewer et al. | 51/308 |
| 6,355,566 B1 | * | 3/2002 | Howard et al. | 438/697 |

FOREIGN PATENT DOCUMENTS

| | | |
|---|---|---|
| JP | 58102539 | 6/1983 |
| JP | 62252950 | 11/1987 |
| JP | A-63-313834 | 12/1988 |
| JP | A-1-107554 | 4/1989 |
| JP | 5175328 | 7/1993 |
| JP | 5235158 | 9/1993 |
| JP | 6314739 | 11/1994 |
| JP | 9260482 | 10/1997 |
| JP | 9260663 | 10/1997 |
| JP | 9275134 | 10/1997 |
| JP | 10107138 | 4/1998 |
| JP | 10200104 | 7/1998 |
| JP | 11097522 | 4/1999 |
| JP | 11121605 | 4/1999 |
| JP | 2000021975 | 1/2000 |

* cited by examiner

Primary Examiner—Matthew Smith
Assistant Examiner—Renzo N. Rocchegiani
(74) Attorney, Agent, or Firm—Posz & Bethards, PLC

(57) ABSTRACT

First, a trench of a semiconductor substrate is filled with a polysilicon film deposited on the surface of the semiconductor substrate. A selective thin film having etching selectivity with respect to the polysilicon film is formed on the polysilicon film. Then, the selective thin film is etched (etched back) so that a part of the selective thin film remains in a depression of the polysilicon film, as a self-aligning mask. The polysilicon film is further etched with the self-aligning mask, thereby forming a polysilicon embedded layer in the trench with a flat surface.

39 Claims, 19 Drawing Sheets

METHOD FOR MANUFACTURING SEMICONDUCTOR DEVICE HAVING TRENCH FILLED WITH POLYSILICON

CROSS REFERENCE TO RELATED APPLICATION

This application is based upon and claims the benefit of Japanese Patent Application No. 2000-143303 filed on May 16, 2000, the contents of which are incorporated herein by reference.

BACKGROUND OF THE INVENTION

1. Field of the Invention

This invention relates to a method for manufacturing a semiconductor device in which a trench is formed on a semiconductor substrate to provide an electrical isolation structure or an embedded gate therein.

2. Description of the Related Art

Recently, a semiconductor device with an electrical isolation (trench isolation) structure or a semiconductor device with an embedded gate (trench type gate) has been proposed in accordance with improved integration degrees of various semiconductor devices.

When this kind of semiconductor device is manufactured, a method shown in FIGS. 16A to 16G has been adopted. FIG. 16A is a flowchart showing the method in a stepwise manner. Specifically, referring to FIG. 16B, an etching mask 52 is formed with an opening 52a at a predetermined position by a mask formation step S101 and a mask opening step S102. Next, as shown in FIG. 16C, a trench 53 is formed on a semiconductor substrate 51 by anisotropically etching the substrate 51 in a thickness direction thereof at a trench formation step S103.

After this anisotropic etching, a thermal oxide film (sacrificial oxide film) formation step S104 and a thermal oxide film removal step S105 are successively carried out on purpose to improve the shape of the trench 53 and to remove an etching damage layer formed on the surface of the semiconductor substrate 51. Then, a mask removal step S106 is carried out to remove the mask 52 as shown in FIG. 16D. Further, at an insulation film formation step S107, as shown in FIG. 16E, an insulation film 54 is formed on the surface of the semiconductor substrate 51 including the inner wall surface of the trench 53 by thermal oxidation.

Then, a polysilicon deposition step S108 is carried out to form a polysilicon film 55 on the insulation film 54 by, for example, a CVD apparatus. Accordingly, the inside of the trench 53 is filled with polysilicon, and from this state, the polysilicon 55 is etched (etched back) at an etching step S109 so that the surface above the trench 53 is flattened. Finally, a polysilicon embedded layer 56 embedded in the trench 53 is obtained as shown in FIG. 16G.

According to this method, however, it is difficult to control an etching amount at the etching step S109. Further, a steep step may be produced in the trench 53 after performing the etching of the polysilicon film 55, due to the etching progressing at a depression 57 (see FIG. 16F) that is produced at a position corresponding to the center of the trench 53 when the polysilicon film 55 is deposited. Therefore, it is difficult to sufficiently flatten the surface above the trench 56.

To reduce the steep step produced at the edge portion of the trench due to flattening, JP-A-63-313834 and JP-A-1-107554 disclose techniques for tapering the opening portion of the trench. According to these techniques, the step produced at the edge portion of the trench can be improved; however, the techniques cannot improve (reduce) the step produced inside the trench after the flattening treatment, due to the depression produced corresponding to the center of the trench.

FIG. 17 shows a relation between the depth of the depression 57 and the thickness of the polysilicon film 55 formed by the method shown in FIGS. 16A to 16G. As shown in FIG. 17, the depth of the depression 57 is decreased as the thickness of the polysilicon film 55 is increased and then tends to saturate at a specific magnitude, although the relation somewhat depends on width W of the trench 53. That is, the depth of the depression 57 is reduced as the thickness of the polysilicon film 55 is increased; however, there exists a limitation in this method, and it is difficult to flatten the surface portion of the trench 53 only by embedding polysilicon therein.

As another conventional technique for flattening a surface of a trench formed on a semiconductor substrate, a manufacturing method is conceivable, which is shown in FIGS. 18A to 18H. FIG. 18A is a flow chart showing the manufacturing method in a stepwise manner. Specifically, after an oxide film formation step S201 is carried out to form an oxide film 59 on a semiconductor substrate 58, a mask formation step S202 for forming a mask and a mask/oxide-film opening step S203 utilizing a photolithography technique are successively carried out. Accordingly, an etching mask 60 having an opening 60a is provided. Further, as shown in FIG. 18B, a trench 61 is formed at a trench formation step S204 involving anisotropic dry etching using the mask 60.

From this state, a thermal oxide film formation step S205 and a thermal oxide film removal step S206 are successively carried out to improve the shape of the trench 61 as shown in FIG. 18C. After that, at an insulation film formation step S207, as shown in FIG. 18D, an insulation film 59 is formed inside the trench 61 with the mask 60, by thermal oxidation. Then, at a polysilicon deposition step S208, as shown in FIG. 18E, a polysilicon film 62 is deposited on the surface of the substrate 58 by, for example, a CVD apparatus, thereby filling the inside of the trench 61 with polysilicon. After that, referring to FIGS. 18F and 18G, for example, a polishing step S209 for removing an extra part of the polysilicon on the semiconductor substrate 58 by CMP (Chemical Mechanical polish) or the like, and a mask removal step S210 for removing the mask 60 are carried out. Further, the part of the polysilicon film 62 projecting from the substrate surface as shown in FIG. 18G is etched at an etching step S211 to remove the step between the surface above the trench 61 and the substrate surface, thereby forming a polysilicon embedded layer 63 embedded in the trench 61 as shown in FIG. 18H.

According to the second conventional technique shown in FIGS. 18A to 18H, although the polysilicon film 62 filling the trench 62 has a depression 64 at a position corresponding to the center of the trench 61 as shown in FIG. 18E, the finally obtained surface above the trench 61 can be flattened without being affected by the depression 64. However, it is difficult to control the degree of parallelization between the substrate surface and the polished surface during the polishing step. Because of this, the projecting part of the polysilicon projecting from the substrate surface shown in FIG. 18G is liable to have large variation in height. This makes it difficult to flatten the surface above the trench. The etching of the projecting part is also difficult to be controlled, resulting in difficulty of flattening as well.

Further, in the case where the projecting part of the polysilicon is etched by dry-etching that is relatively easily controlled, the substrate surface, especially the property of the insulation film 59 disposed in the vicinity of the opening of the trench 61 is deteriorated by the etching, resulting in deterioration in isolation withstand voltage when trench isolation is provided with the trench 61. This also results in deterioration in gate withstand voltage in case where the trench 61 is used for an embedded gate (trench type gate).

Thus, in the conventional manufacturing methods, the surface above the trench cannot be flattened sufficiently and may have steps, otherwise, the flattened surface may have variations. Because of this, in the case of the trench isolation, wiring members are difficult to be disposed above the trench, or wiring members disposed above the trench are liable to deteriorate due to the steps or large variations on the surface. In the case of the trench type gate, an electric field is liable to concentrate on the steps on the trench, the degree of electric field concentration varies within the substrate surface, and accordingly characteristics of the device deteriorates.

SUMMARY OF THE INVENTION

The present invention has been made in view of the above problems. An object of the present invention is to provide a method for manufacturing a semiconductor device capable of improving flatness of a surface of a semiconductor substrate above a trench securely.

According to the present invention, after a polysilicon film is formed on a semiconductor substrate to fill an inside of a trench, a selective thin film is formed on the polysilicon film. The selective thin film has etching selectivity with respect to the polysilicon film when the polysilicon film is etched. Then, an etch-back step is successively performed to the selective thin film and the polysilicon film.

Accordingly, the polysilicon film can be etched with a self-aligning mask that can be formed from a part of the selective thin film and left in a depression of the polysilicon film above the trench at the etch-back step of the selective thin film. The self-aligning mask can suppress etching of the polysilicon film above the trench, and prevent steps from being produced above the trench due to the depression. As a result, the surface of the semiconductor substrate above the trench can be flattened easily and sufficiently.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

Figure 1A:
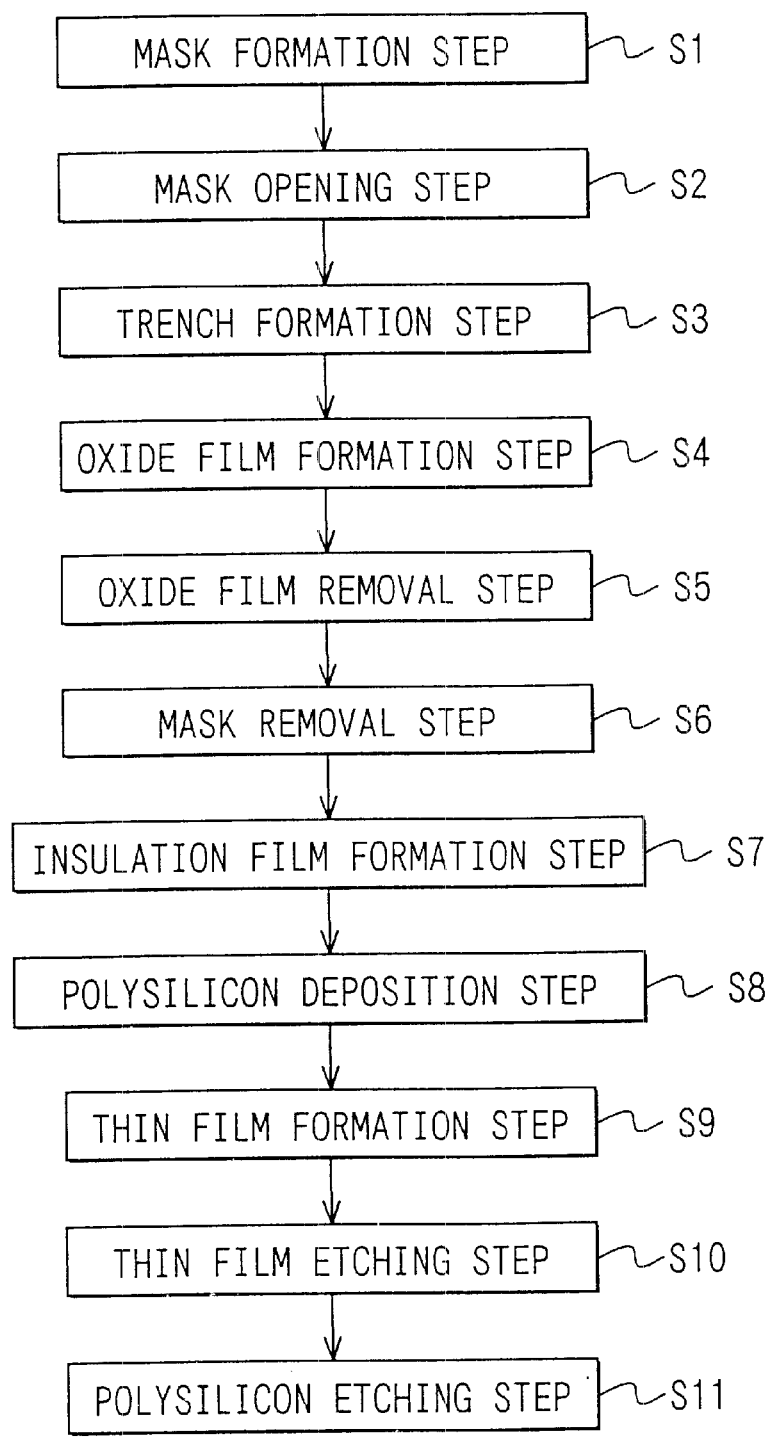
FIG. 1A is a flowchart showing a method for manufacturing a semiconductor device according to a first embodiment of the present invention.
Figure 1B:
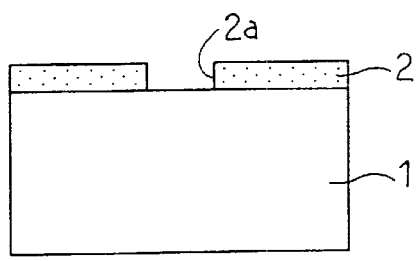
FIGS. 1B to 1I are cross-sectional views showing the semiconductor device at several steps shown in FIG. 1A.

A method for manufacturing a semiconductor device in a first preferred embodiment is explained with reference to FIGS. 1A through 1I in which FIG. 1A is a flowchart showing the method in a stepwise manner. As shown in FIG. 1B, an etching mask 2 is formed on a semiconductor substrate (silicon substrate) 1 to have an opening portion 2a at a specific position by successively performing a mask formation step S1 for forming the mask and a mask opening step S2 for patterning the mask using a photolithography technique.

Figure 1F:
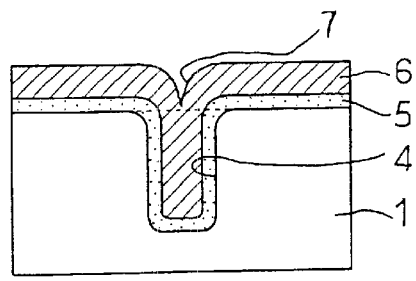
Figure 1C:
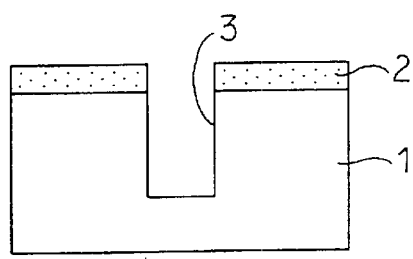

Then, at a trench formation step S3 shown in FIG. 1C, a trench 3 is formed on the semiconductor substrate 1 by anisotropic etching that is performed in the thickness direction of the semiconductor substrate 1. Residues produced inside the trench 3 during the anisotropic etching are removed by diluted hydrofluoric acid solution. After that, at a thermal oxide film (sacrificial oxide film) formation step S4, a thermal oxide film (sacrificial oxide film) having a thickness of about 100 nm is deposited in dry oxygen atmosphere at, for example, oxidization temperature of 1100° C. Further, at a thermal oxide film removal step S5, the thermal oxide film is removed by diluted hydrofluoric acid solution. Then, the mask 2 is removed at a mask removal step S6. Accordingly, as shown in FIG. 1D, the trench 4 is provided with a smooth shape in a state where an etching damage layer is reduced.

Figure 1G:
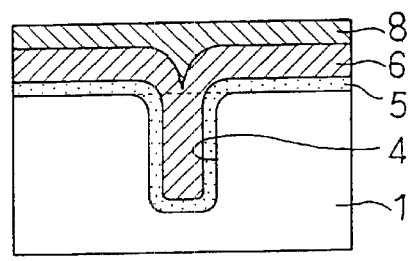
Figure 1D:
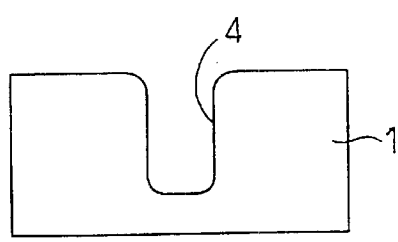
Figure 1H:
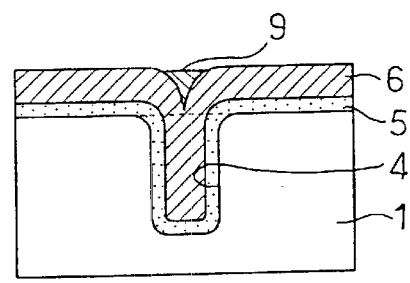
Figure 1E:
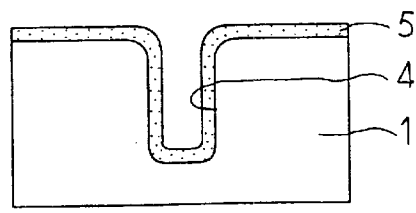

Next, at an insulation film formation step S7, as shown in FIG. 1E, an insulation film 5 is deposited on the surface of the semiconductor substrate 1 including the inner wall surface of the trench 4 by performing a low-temperature thermal oxidation treatment at, for example, 800° C. to 900° C. The insulation film 5 may be deposited only on the inner wall surface of the trench 4 at this stage.

Then, at a polysilicon deposition step S8 shown in FIG. 1F, a polysilicon film 6 is deposited on the insulation film 5 by, for example, a CVD apparatus, thereby filling the trench 4 with polysilicon. The polysilicon film 6 is formed at this step to have a depression (concave portion) 7 at a surface portion thereof corresponding to approximately a center of the trench 4. The thickness of the polysilicon film 6 is controlled so that the depression 7 has a bottom portion, a position of which is approximately coplanar with or preferably higher than the surface of the semiconductor substrate 1.

After that, at a thin film formation step S9, as shown in FIG. 1G, a selective thin film 8 having etching selectivity with respect to polysilicon is formed on the surface of the polysilicon film 6. In this case, the selective thin film 8 is a CVD oxide film made of TEOS (Tetra Ethyl Ortho-Silicate) or containing at least one of phosphorus and boron such as BPSG (Boron-doped Phosphor Silicate Glass) film. The surface of the selective thin film 8 is flattened by a reflow treatment or the like.

A step for densifying the polysilicon film 6 may be performed previous to the thin film formation step S9. Otherwise, a step for densifying both the polysilicon film 6 and the selective thin film 8 may be performed after the thin film formation step S9 is performed.

Next, at a thin film etching step (thin film etch-back step) S10, as shown in FIG. 1H, the selective thin film 8 is removed (etched back) by anisotropic etching. At that time, the portion of the selective thin film 8 embedded in the depression 7 is left without being removed by etching, and the remaining portion works as a self-aligning mask 9, formed through self alignment, at a polysilicon etching step S11 following this step.

Figure 1I:
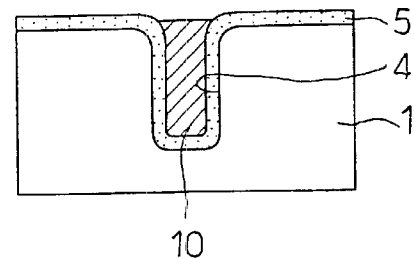

At the polysilicon etching step (polysilicon etch-back step) S11, as shown in FIG. 1I, the polysilicon film 6 is removed (etched back) by isotropic etching. For example, the polysilicon film 6 is etched by a wet treatment, using a mixed solution of, for example, hydrofluoric acid:nitric acid=1:50–300, more preferably, hydrofluoric acid:nitric acid=1:100, so as not to damage the entire area of the substrate surface including the surface of the trench 4. Finally, a polysilicon embedded layer 10 embedded in the trench 4 is obtained.

According to the manufacturing method as described above, when the polysilicon film 6 is etched at the polysilicon etching step S11, the etching is suppressed by the self-aligning mask 9 where the trench 4 underlies, and the controllability of the etching is improved. Therefore, a steep step is not produced on the trench 4 due to the etching progressing at the depression 7 of the polysilicon film 6 corresponding to the center of the trench 4. That is, the surface of the trench 4 can be flattened without producing steps after the polysilicon film 6 is etched, by a simple manner adopting the thin film formation step S9 for forming the selective thin film 8 and the thin film etching step S10 for etching the thin film 8. As a result, the flatness of the surface of the semiconductor substrate 1 can be improved. The polysilicon embedded layer 10 can be provided with high flatness and high reliability.

Figure 2A:
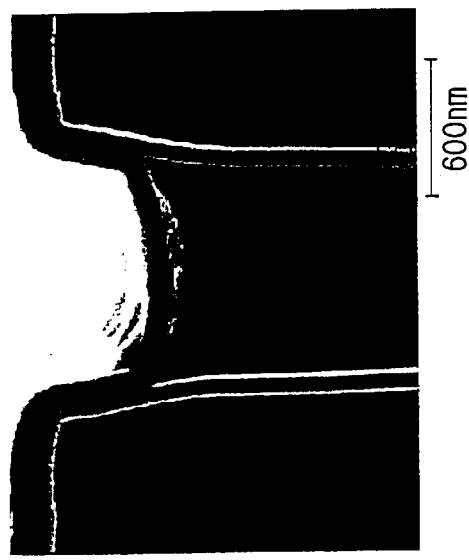
FIGS. 2A and 2B are photomicrographs of samples A and B showing trench structures.
Figure 2B:
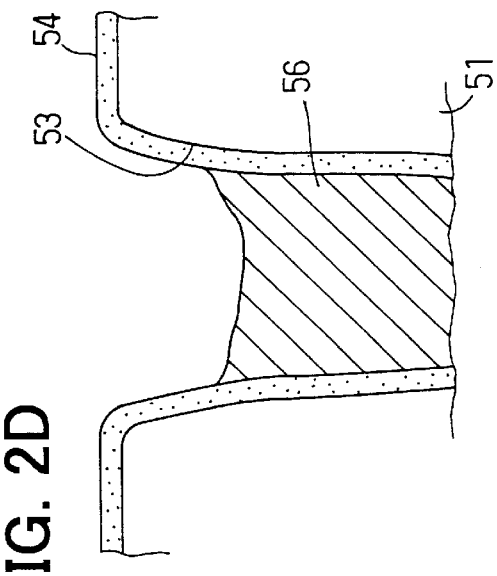
Figure 2C:
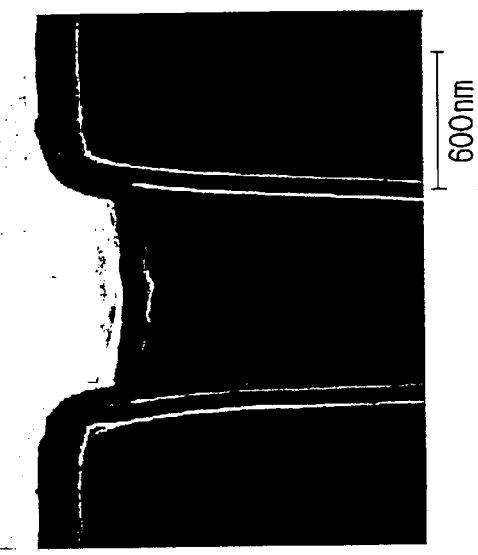
FIGS. 2C and 2D are schematic views respectively illustrating the photomicrographs of FIGS. 2A and 2B with reference numerals.
Figure 2D:
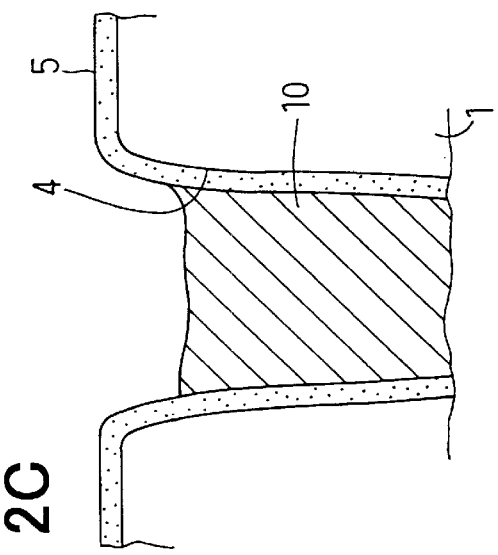

Here, FIGS. 2A and 2B are photomicrographs of samples A and B taken by an electron microscope to explain effects of the flattened surface of the trench 4, and FIGS. 2C and 2D are illustrations corresponding to the photomicrographs of FIGS. 2A and 2B. Sample A shown in FIG. 2A is the polysilicon embedded film 10 manufactured at following conditions according to the present embodiment, and sample B shown in FIG. 2B is a polysilicon embedded layer 53 formed at following conditions as a comparative example.

Sample A

In the manufacturing method shown in FIG. 1A, after the trench 4 and the insulating film 5 are formed, the polysilicon film 6 is formed so that the bottom portion of the depression 7 is located at a position higher than the surface of the semiconductor substrate 1. Considering the relation between the thickness of polysilicon and the depth of the depression shown in FIG. 17, the polysilicon film 6 is deposited to have a thickness of, for example, about 0.8 $\mu$m. After that, a BPSG film having a thickness of 0.5 $\mu$m is deposited as the selective thin film 8, and a heat treatment is performed to the polysilicon film 6 and the selective mask 9 is formed by performing the anisotropic etching, and then the polysilicon film 6 is etched by the wet treatment using a mixed solution of hydrofluoric acid:nitric acid=1:100.

Sample B

Figure 16A:
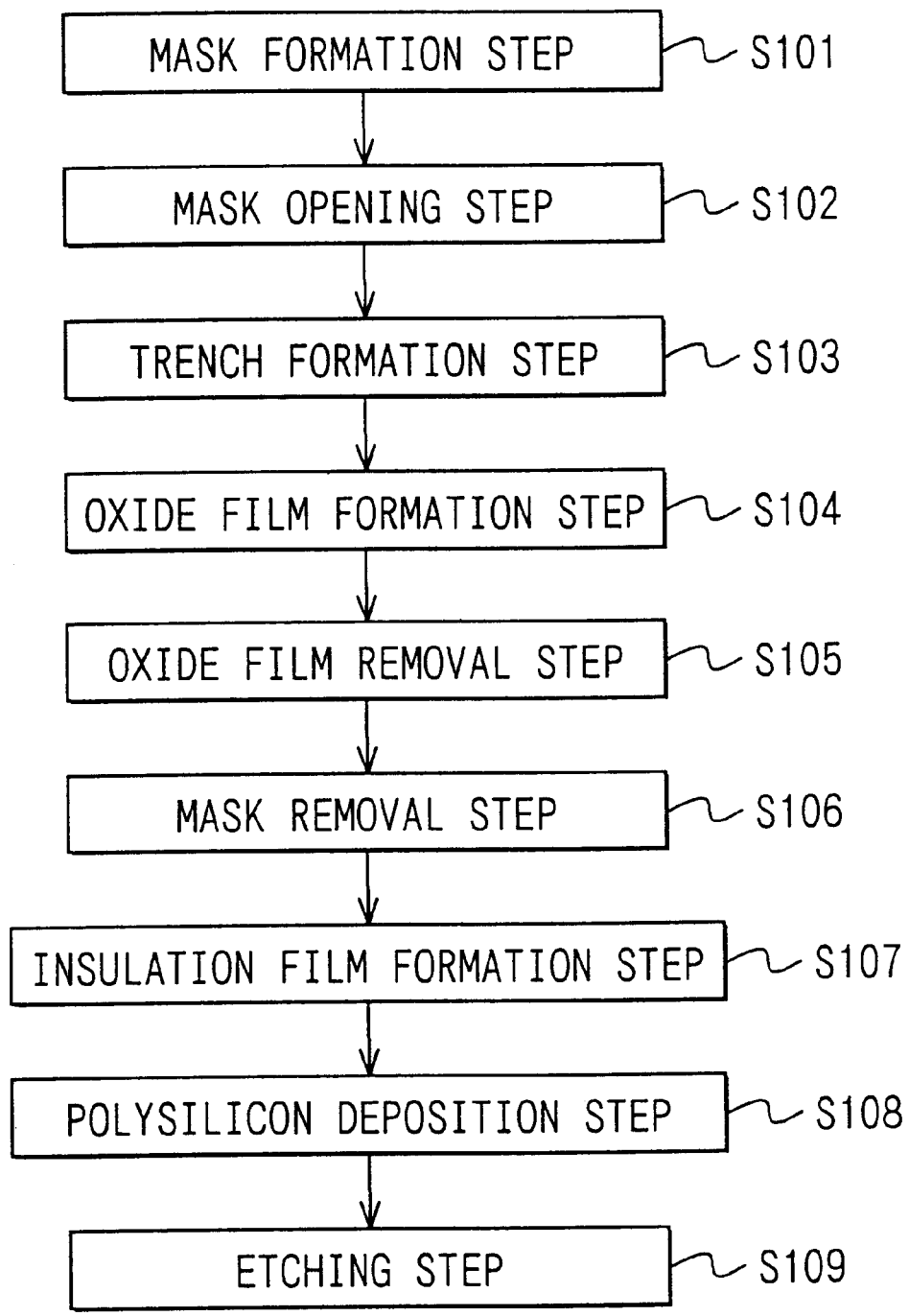
FIG. 16A is a flowchart showing a method for manufacturing a semiconductor device according to a prior art.
Figure 16B:
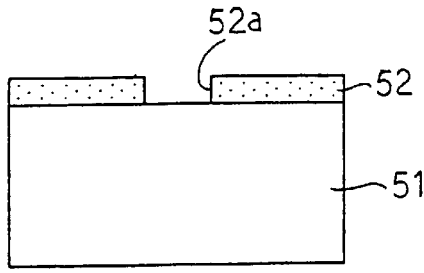
FIG. 16B to 16G are cross-sectional views showing the semiconductor device at several steps shown in FIG. 16A.
Figure 16C:
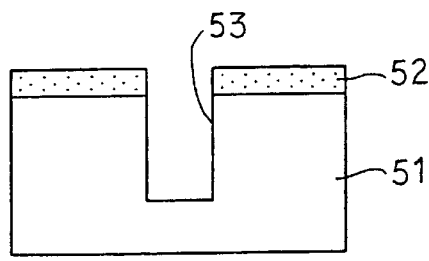
Figure 16D:
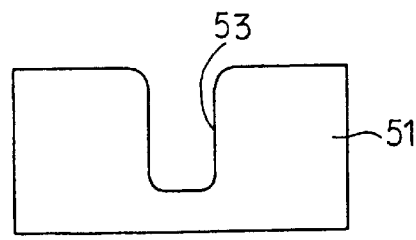
Figure 16E:
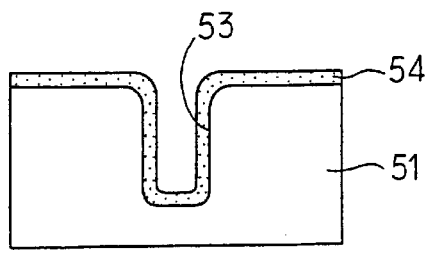
Figure 16F:
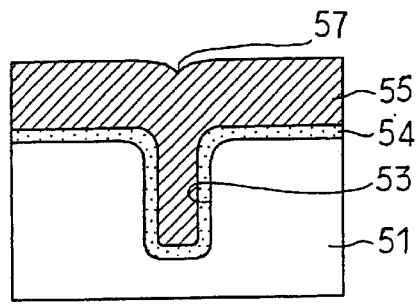
Figure 17:
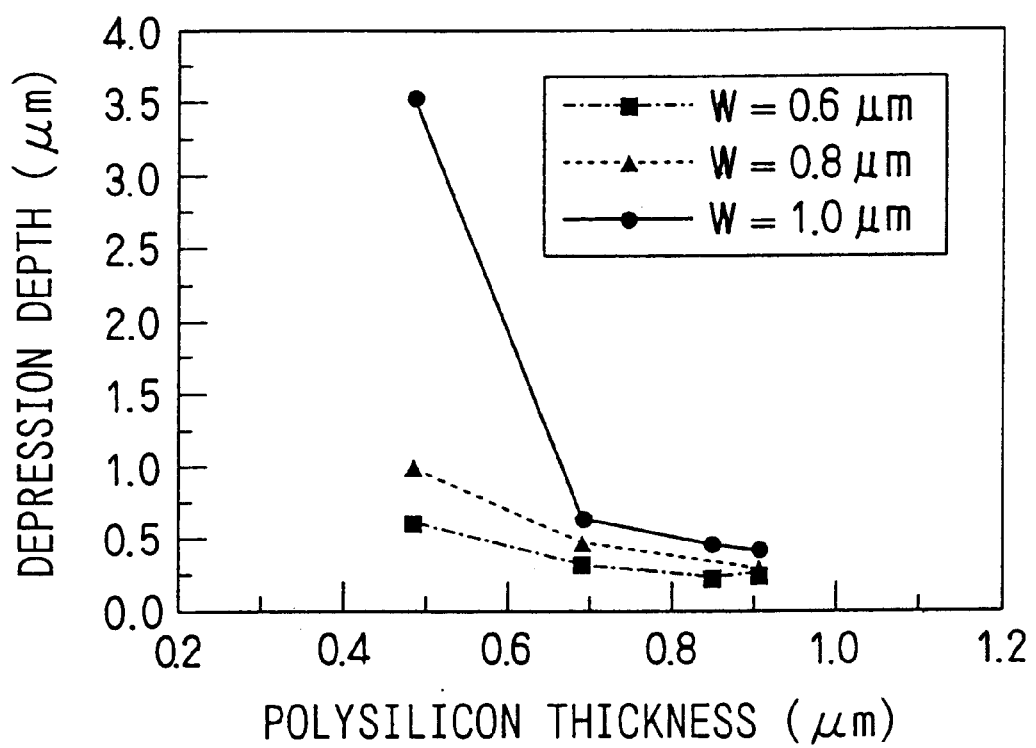
FIG. 17 is a graph showing a relation between a thickness of polysilicon deposited on a semiconductor substrate and a depth of a depression formed on the polysilicon at a position corresponding to a trench in the semiconductor substrate.
Figure 18A:
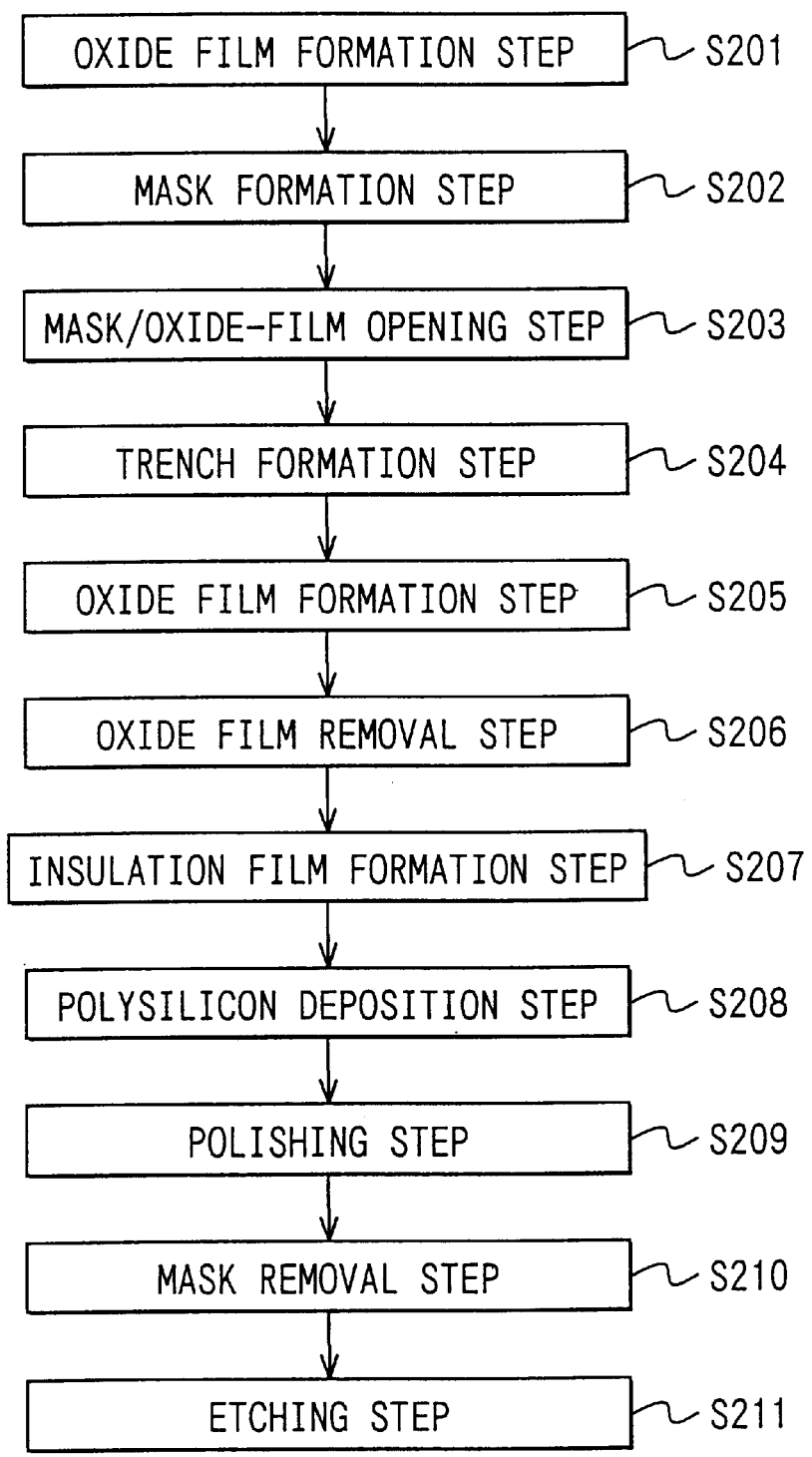
FIG. 18A is a flowchart showing a method for manufacturing a semiconductor device according to another prior art.
Figure 18B:
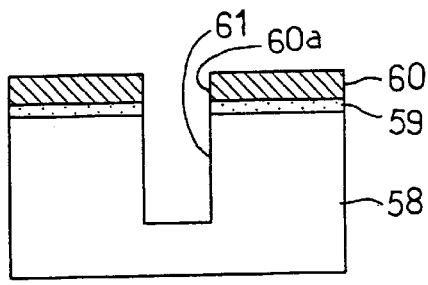
FIGS. 18B to 18H are cross-sectional views showing the semiconductor device at several steps shown in FIG. 18A.
Figure 18E:
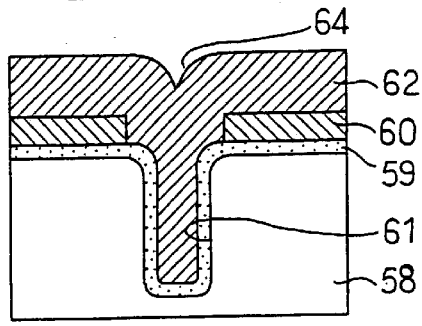
Figure 18C:
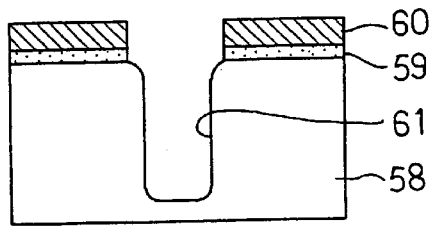
Figure 18F:
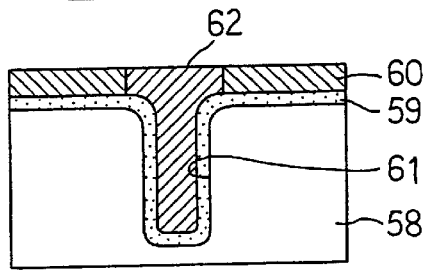
Figure 18D:
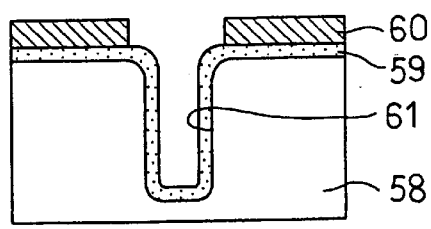
Figure 18G:
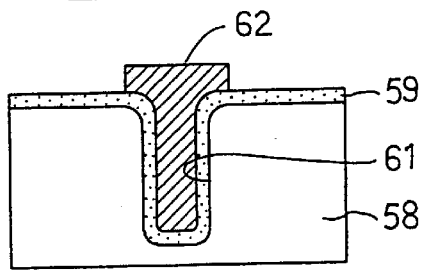
Figure 18H:
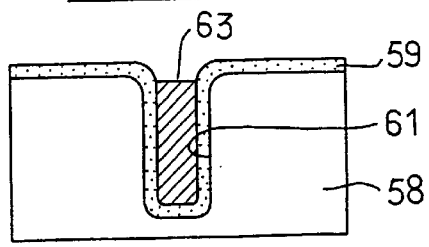

In the manufacturing method shown in FIG. 16A, after the insulation film 54 is formed, the polysilicon film 55 is deposited to have a thickness of 1.0 $\mu$m at which the depth of the depression 57 is saturated as shown in FIG. 17. Then, a heat treatment is performed to the polysilicon film 55 at 95° C. for 20 minutes to make the crystalline state of the polysilicon uniform, and the surface of the polysilicon film 55 is cleaned. Then, the polysilicon film 55 is etched by a wet treatment using a mixed solution of hydrofluoric acid-:nitric acid=1:100.

As understood from FIGS. 2A and 2B, the surface flatness of sample A manufactured according to the present embodiment is significantly improved (i.e., the steps are reduced) as compared to that of sample B manufactured according to the prior art.

Figure 3B:
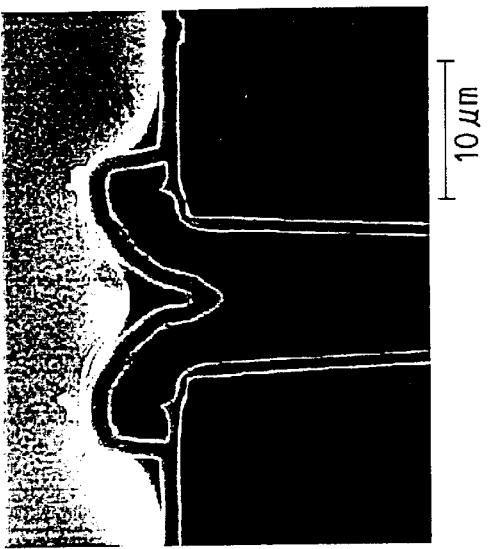
FIGS. 3A and 3B are photomicrographs of samples A1 and A2 showing trench and wiring structures.
Figure 3D:
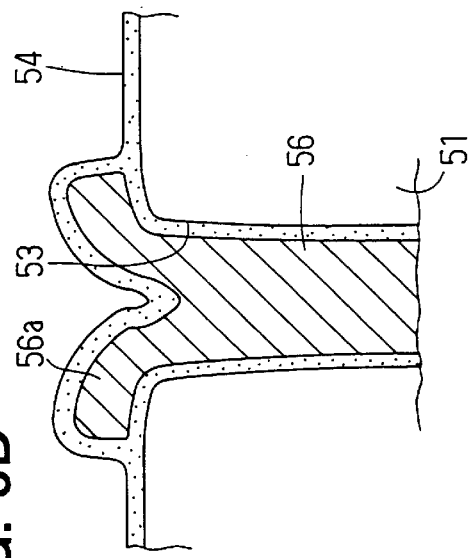
FIGS. 3C and 3D are schematic views respectively illustrating the photomicrographs of FIGS. 3A and 3B with reference numerals.
Figure 3A:
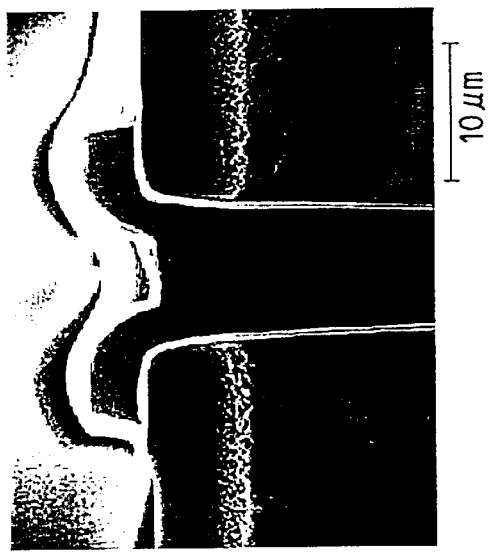
Figure 3C:
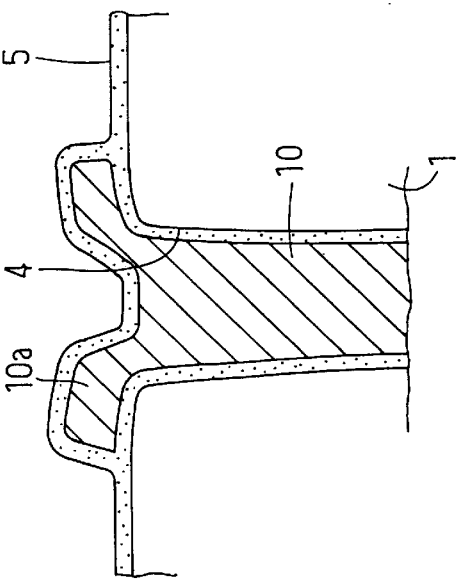
Figure 16G:
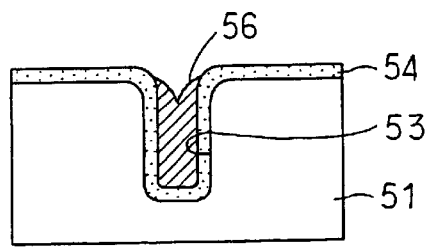

Moreover, FIG. 3A is a photomicrograph of sample A1 that was formed by depositing and patterning a polysilicon 10a for an upper gate electrode or a wiring member on sample A. FIG. 3B is a photomicrograph of sample B1 that was formed by depositing and patterning a polysilicon 56a similarly to sample A1, on sample B after the polysilicon film 55 is dry-etched as shown in FIG. 16G. Incidentally, the photomicrographs of FIGS. 3A and 3B are also taken by the electron microscope, but have a magnification different from that of FIGS. 2A and 2B. FIGS. 3C and 3D are illustrations respectively corresponding to the photomicrographs of FIGS. 3A and 3B.

As understood from FIGS. 3A to 3D, in a case where each cross-sectional shape of the polysilicon 10a, 56a should have a T-like shape, sample A1 manufactured according to the present embodiment can have an appropriate shape as compared to that of sample B1. That is, the depression of the polysilicon 10a is small and smooth as compared to that of the polysilicon 56a that is irregularly deformed.

Also, in the manufacturing method according to the present embodiment, the electrical property of the polysilicon embedded layer 10 formed in the trench 4 can be improved by a heat treatment for densifying the polysilicon film 6 before the thin film formation step S9 is performed, or a heat treatment for densifying the polysilicon film 6 and the selective thin film 8 after the thin film formation step S9 is performed. Especially when the selective thin film 8 is made of material having thermal transience as in the present embodiment, the flatness of the selective thin film 8 can be improved by the heat treatment as described above. Consequently, the surface steps on the trench 4 can be further reduced, and the surface of the semiconductor substrate 1 can be flattened more sufficiently.

In the present embodiment, the selective thin film 8 is preferably composed of a CVD oxide film made of TEOS having thermal transience, or a CVD oxide film containing, as an impurity, at least one of phosphorus and boron having thermal transience as well. In this case, a reflow treatment can sufficiently improve the flatness of the selective thin film 8. Therefore, at the stage when the thin film etching step S10 for etching the selective thin film 8 is finished, the self-aligning mask 9, remaining in the depression 7 of the polysilicon film 6, can be securely formed. In consequence, the surface of the semiconductor substrate 1 can be flattened more sufficiently. Also, because the selective thin film 8 is etched anisotropically at the thin film etching step S10, the removal of the selective thin film 8 can be performed sufficiently.

In the present embodiment, after the trench formation step S3 is performed to form the trench 3 on the semiconductor substrate 1, the thermal oxide film (sacrificial oxide film) formation step S4 for forming the thermal oxide film on the surface of the semiconductor substrate 1 including the inner wall surface of the trench 3 and the thermal oxide film removal step S5 for removing the thermal oxide film are successively carried out. Therefore, the shape of the trench 4 provided as above can be smoothed, and the etching damage layer on the surface of the semiconductor substrate 1 can be removed simultaneously. As a result, the electrical characteristics of the semiconductor device attained finally can also be improved.

Also, in the present embodiment, the polysilicon film 6 is deposited to fill the trench 4 and to have a thickness that allows the depression 7 provided at a surface portion corresponding to the trench 4 to have a bottom, a position of which is approximately coplanar with or higher than the surface of the semiconductor substrate 1. Therefore, the surface of the polysilicon embedded layer 10 finally left filling the trench 4 can be prevented from being concaved into the trench 4, and sufficient flatness of the surface above the trench 4 can be attained.

Next, the effects affecting the electric characteristics of the semiconductor device in the case where the polysilicon film 6 is etched by the wet treatment involving isotropic etching were examined. The evaluation method and results are described below.

For example, in a case of a planar type MOS capacitor, generally, defects called "traps" are liable to be produced within a gate insulation film due to etching damage or the like. In this case, in current-voltage characteristic when a bias is applied to induce an accumulation state, current starts to flow due to a trap assist tunneling phenomenon at an applied voltage that is lower than that in a case of no trap, and after that, electric field is relaxed in the insulation film because charges are accumulated in the traps. Therefore, it is widely known that the current-voltage characteristic in this case have a bump (called "camel bump") in comparison with the current-voltage characteristic in the case of no trap.

Figure 4:
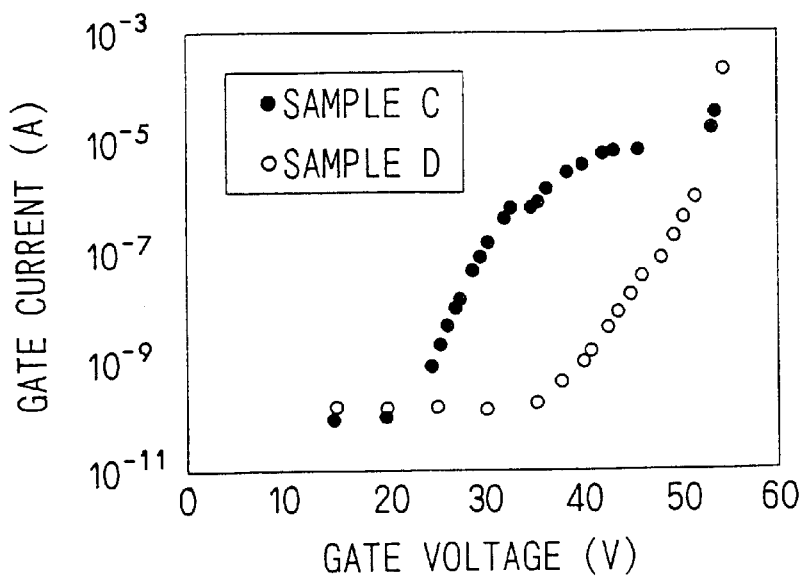
FIG. 4 is a graph showing current-voltage characteristics of planar type capacitors.

FIG. 4 shows current-voltage characteristics that were obtained respectively from a planar type MOS capacitor (sample C) in which a damage layer was intentionally formed on a gate insulation film (thermal oxide film) by anisotropic etching, and from a planar type MOS capacitor (sample D) in which no damage layer was formed. As shown in FIG. 4, the planar type MOS capacitor of sample C formed with the damage layer has a "camel bump" in the current-voltage characteristic as described above.

Figure 5:
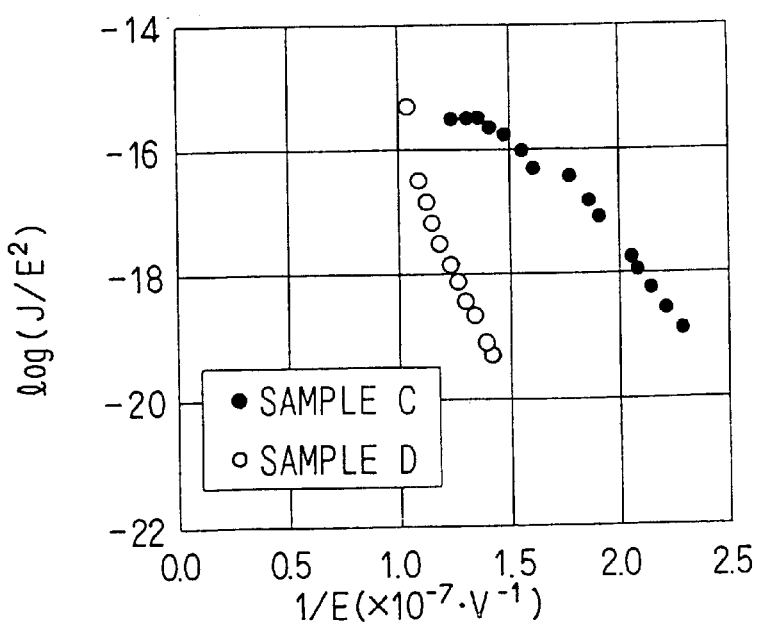
FIG. 5 is an FN plot characteristic graph of the current-voltage characteristics of the planar type capacitors.

FIG. 5 shows results using a well-known FN plot (Fowler-Nordheim Plot) for comparing the respective current-voltage characteristics of the planar type MOS capacitor (sample C) having traps produced in the thermal oxide film (gate oxide film) due to the damage layer, and of the planar type MOS capacitor (sample D) to which the treatment for forming the damage layer was not performed. As understood from FIG. 5, the slope of sample C is significantly smaller than that of sample D. In addition, it was revealed that the slope of sample C could be increased to approach that of sample D having no damage layer by recovering the damages.

In the present embodiment, a ratio (slope ratio) of the FN plot with respect to the FN plot of a planar type MOS capacitor having a thermal oxide film with good quality is used as an index for evaluating film characteristics of the insulation film 5 formed inside the trench 4, based on the fact that the etching damage in the MOS capacitor affects on the FN plot of the current-voltage characteristic. The film characteristics become better as the slope ratio approaches "1".

Figure 6A:
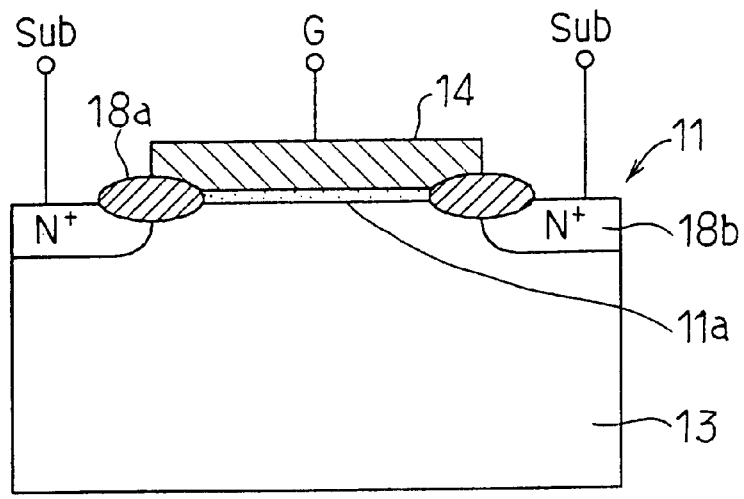
FIGS. 6A and 6B are cross-sectional views showing structures of a planar type MOS capacitor and a T type trench MOS capacitor.
Figure 6B:
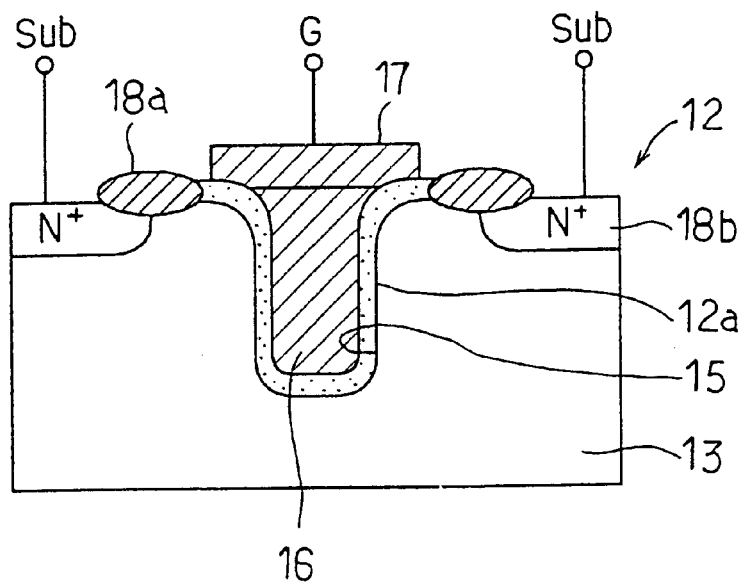

In order to explain the effects regarding the electric characteristics of the semiconductor device, according to the manufacturing method of the present embodiment, two types of semiconductor devices, i.e., a planar type MOS capacitor 11 shown in FIG. 6A and a planar type MOS capacitor (T type trench MOS capacitor) 12 shown in FIG. 6B are prepared. The MOS capacitors 11, 12 are formed on semiconductor substrates 13 having the same specification as each other, and those gate insulation films 11a, 12a are composed of thermal oxide films, respectively.

In the planar type MOS capacitor 11, two samples are prepared as samples E1 and E2. In sample E1, a polysilicon film is formed on the gate insulation film 11a, and is patterned by dry etching having high controllability, so that a gate electrode 14 made of polysilicon is formed. In sample E2, the polysilicon film is patterned by wet etching using a mixed solution of hydrofluoric acid:nitric acid=1:100 as described in the present embodiment, so that the gate electrode 14 made of polysilicon is formed. The two samples E1 and E2 are compared to each other in gate withstand voltage and in slope ratio of the FN plot.

Also, in the T type trench MOS capacitor 11, two samples are prepared as samples F1 and F2. In sample F1, a polysilicon film is formed on a gate insulation film 12a and a gate electrode 16 that are embedded in a trench 15. The polysilicon film is then etched by dry etching having high controllability, so that a surface gate electrode 17 made of polysilicon is formed. In sample F2, the polysilicon film is etched by a wet treatment using a mixed solution of hydrofluoric acid:nitric acid=1:100 as described in the present embodiment, so that the surface gate electrode 17 made of polysilicon is formed. The two samples F1 and F2 are also compared to each other in gate withstand voltage and in slope ratio of the FN plot. In FIGS. 6A and 6B, reference numeral 18a denotes a LOCOS oxide film, and reference numeral 18b denotes an $N^+$ contact layer.

Figure 7:
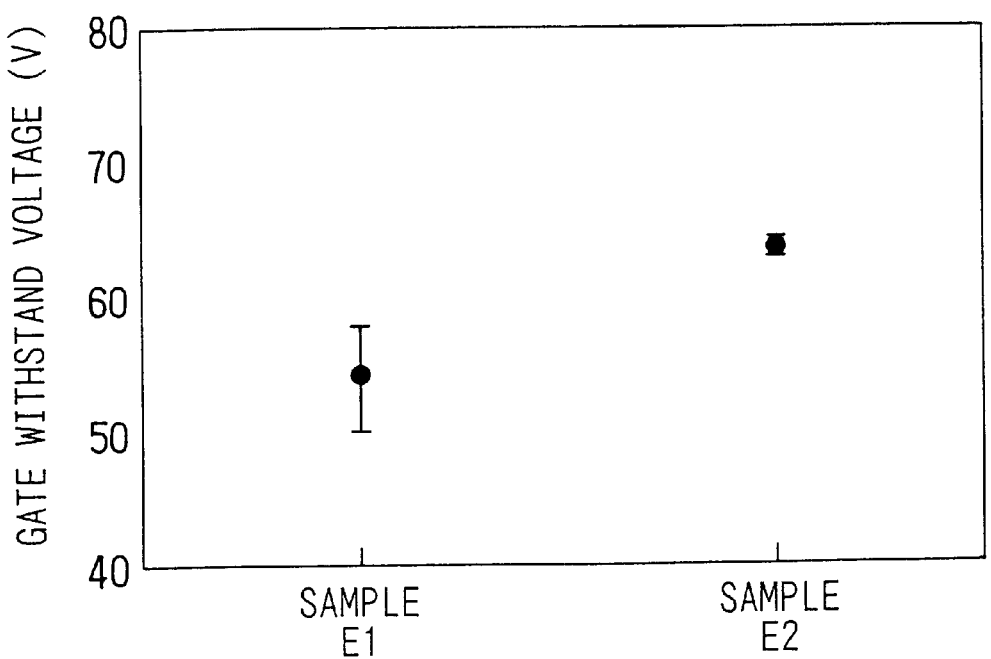
FIG. 7 is a graph for explaining an effect that affects a gate withstand voltage of the planar type MOS capacitor.

FIG. 7 shows a result comparing the two samples E1 and E2 of the planar type MOS capacitor 11 by measuring gate withstand voltages. Here, defined as a gate withstand voltage is a gate voltage in a state where an absolute value of gate current becomes 10 nA in the current-voltage characteristic when a positive bias is applied to induce an accumulation state of carriers (electrons). As understood from FIG. 7, sample E2, which is formed by etching the polysilicon by the wet treatment using the mixed solution of hydrofluoric acid and nitric acid as in the present embodiment, has a higher gate withstand voltage and smaller variation that those of sample E1.

Figure 8:
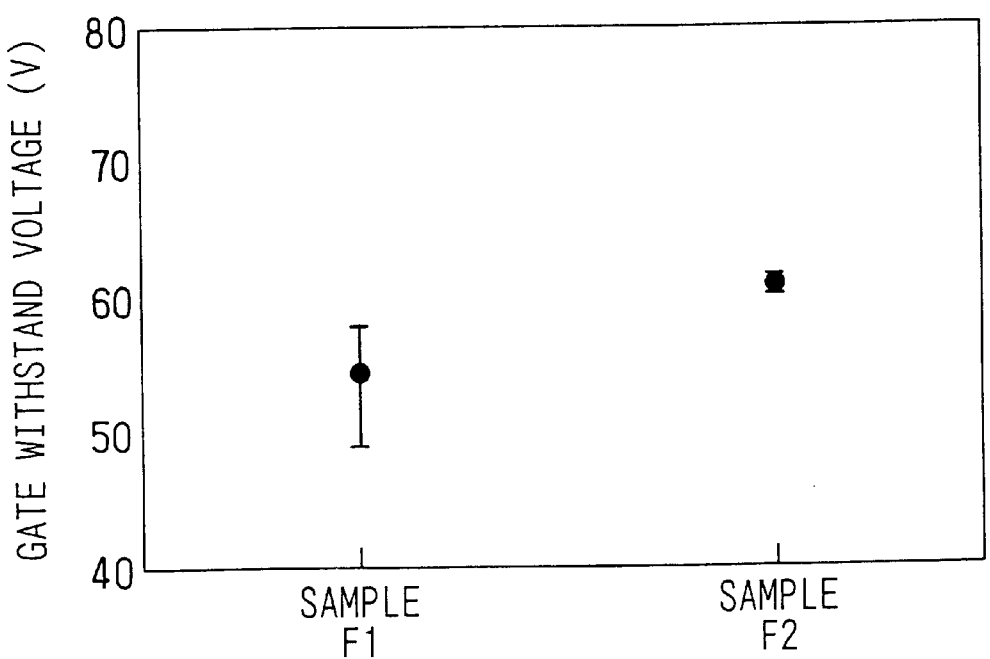
FIG. 8 is a graph for explaining an effect that affects a gate withstand voltage of the T type trench MOS capacitor.

Similarly, FIG. 8 shows a result comparing the two samples F1 and F2 of the T type trench MOS capacitor 12 in gate withstand voltage. As understood from FIG. 8, sample F2 manufactured by the method according to the present embodiment has a higher gate withstand voltage and a smaller variation than those of sample F1.

Moreover, in order to evaluate the gate insulation films, the above-described four samples E1, E2, F1, and F2 of the planar type MOS capacitor 11 and the T type trench MOS capacitor 12 are further compared to one another in the slope ratio of the FN plot with respect to the FN plot of a planar type MOS capacitor having a thermal oxide film with good quality involving no etching damage. The results are explained below.

Figure 9:
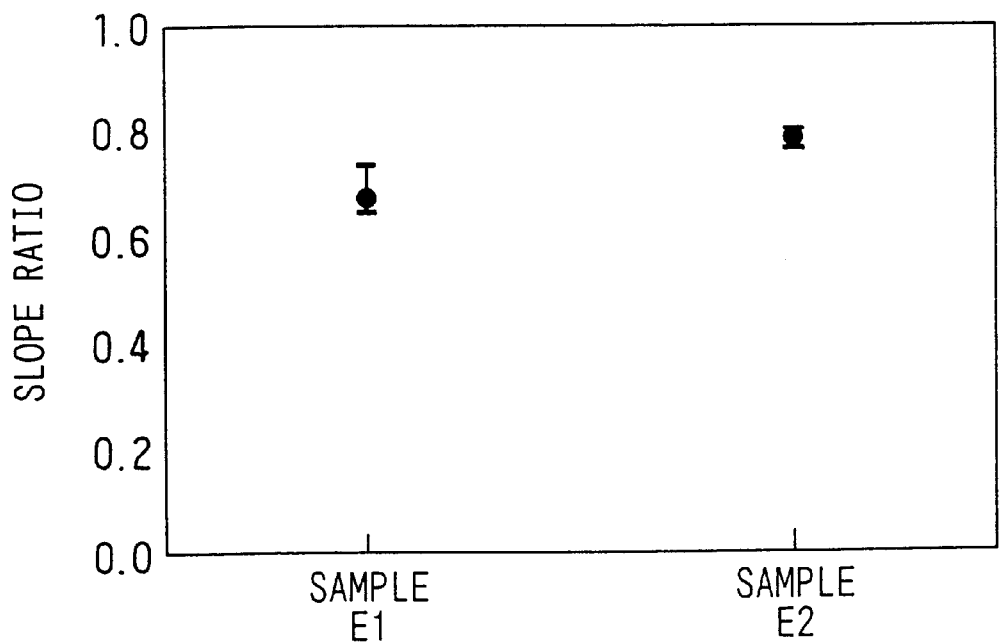
FIG. 9 is a graph showing a result comparing FN plot slope ratios of samples of the planar type MOS capacitor.

FIG. 9 shows a result comparing the slope ratios of samples E1 and E2 of the planar type MOS capacitor 11 manufactured as described above. As understood from FIG. 9, the gate insulation film 11a of sample E2 manufactured by the method according to the present embodiment is closer to "1" than sample E1 manufactured according to the prior art. That is, it is revealed that sample E2 has the thermal oxidation film with less damage than that of sample E1.

Figure 10:
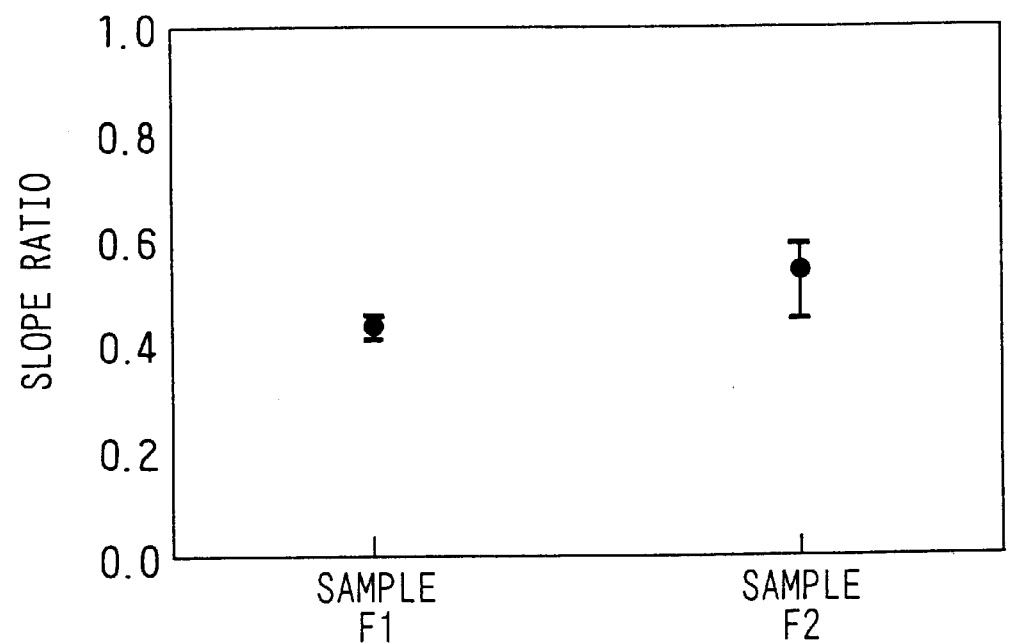
FIG. 10 is a graph showing a result comparing FN plot slope ratios of samples of the T type trench MOS capacitor.

Similarly, FIG. 10 shows a result comparing the slope ratios of samples F1 and F2 of the T type MOS capacitor 12 manufactured as described above. As shown in FIG. 10, sample F2 manufactured according to the present embodiment has a slope ratio closer to "1" than that of sample F1 manufactured according to the prior art. That is, sample F2 can have better film quality.

Figure 11A:
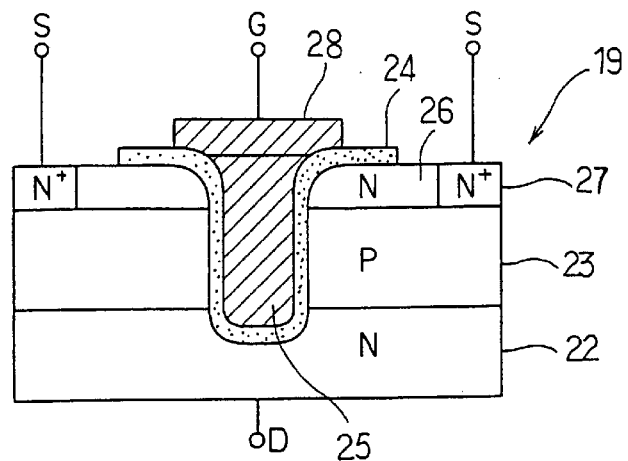
FIGS. 11A to 11C are cross-sectional views showing various structures of semiconductor devices for evaluating effects affecting electrical characteristics.
Figure 11B:
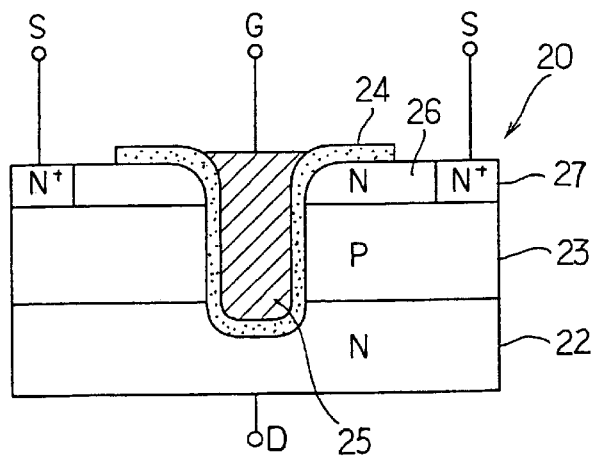
Figure 11C:
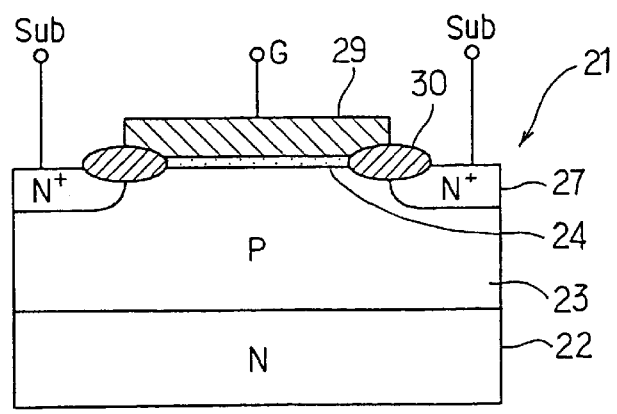

On the other hand, because electric field is liable to concentrate on depending on the shapes of the opening portion and the bottom portion of the trench when trench type capacitors are compared to each other, three capacitors shown in FIGS. 11A to 11C are considered. Specifically, FIG. 11A shows a T type trench MOS transistor 19, FIG. 11B shows an I type trench MOS transistor 20, and FIG. 11C shows a planar type capacitor 21. In FIGS. 11A to 11C, reference numeral 22 denotes an N type semiconductor substrate (silicon substrate), reference numeral 23 denotes a P type diffusion layer, reference numeral 24 denotes a gate insulation film, reference numeral 25 denotes a gate embedded electrode, reference numeral 26 denotes an N type diffusion layer, reference numeral 27 denotes an $N^+$ layer, reference numeral 28 denotes a surface gate electrode, reference numeral 29 denotes a gate electrode, and reference numeral 30 denotes a LOCOS film.

In each of the MOS transistors 19, 20 and the planar type capacitor 21, the gate insulation film 24 is composed of an ONO film that is formed as follows. That is, after a CVD oxide film is formed on the semiconductor substrate 22 from TEOS as source material to have a thickness of 20 nm, thermal oxidation is performed so that an entire thickness of a silicon oxide film becomes 34 nm. Then, a silicon nitride film of 30 nm in thickness is deposited thereon by a low pressure CVD method, and thermal oxidation is further carried out, thereby forming the ONO film.

Each of the MOS transistors 19, 20 and the planar type capacitor 21 is formed by utilizing the manufacturing method according to the present embodiment to have the gate insulation film 24 composed of the ONO film. Then, those slope ratios with respect to the planar type capacitor including a gate insulation film composed of a thermal oxide film having good film quality involving no etching damage are compared, and the results are shown in FIGS. 12 and 13.

Figure 12:
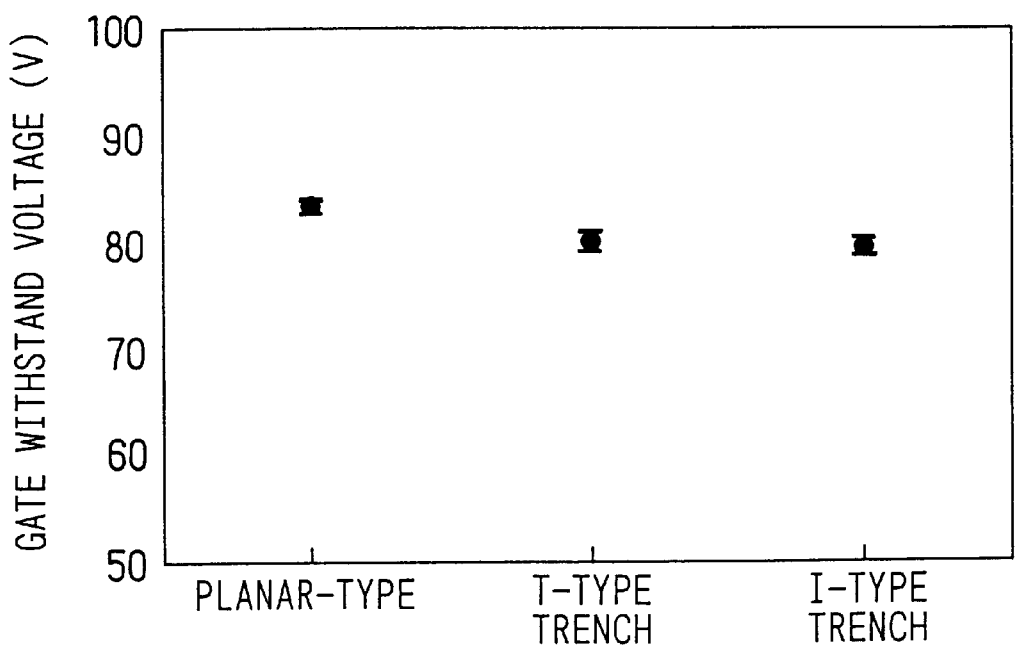
FIG. 12 is a graph showing gate withstand voltages of the semiconductor devices.
Figure 13:
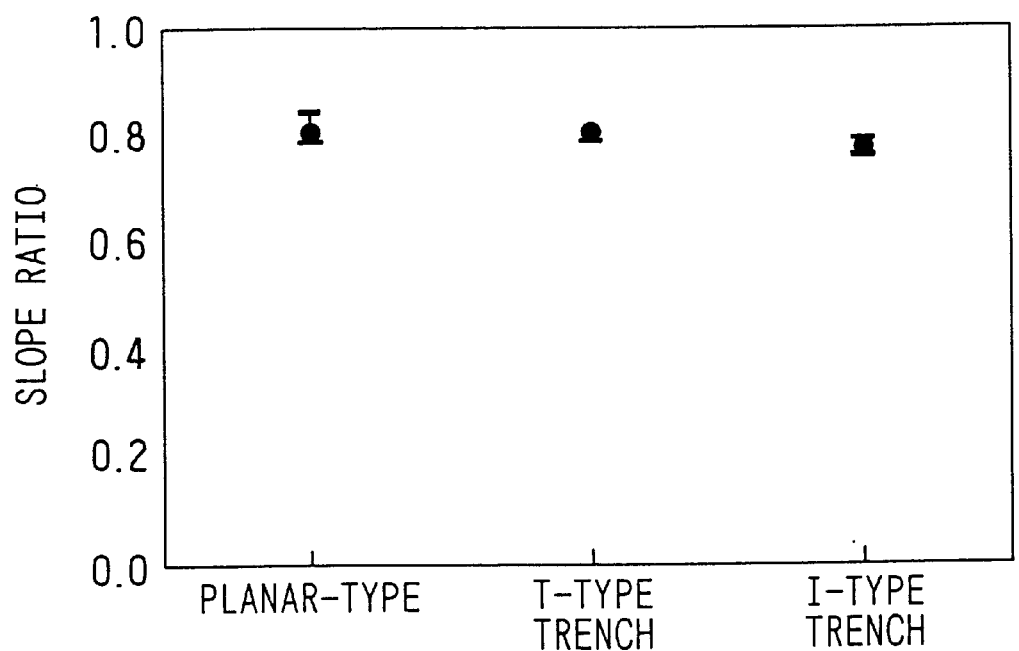
FIG. 13 is a graph showing a result comparing FN plot slope ratios of the semiconductor devices.

As shown in FIG. 12, although there exists a little difference in electric field concentration between the planar type and the trench type, both the T type trench MOS transistor 19 and the I type trench MOS transistor 20 can have gate withstand voltages approximately equal to that of the planar type capacitor 21. In addition, as shown in FIG. 13, regardless of the structures of the T type trench and the I type trench, the film qualities of the gate insulation films can be made approximately equal to that of the planar type capacitor.

Second Embodiment

FIGS. 14A through 14I show a manufacturing method according to a second embodiment that is modified from the first embodiment, and only portions different from those of the first embodiment are explained specifically below.

Figure 14A:
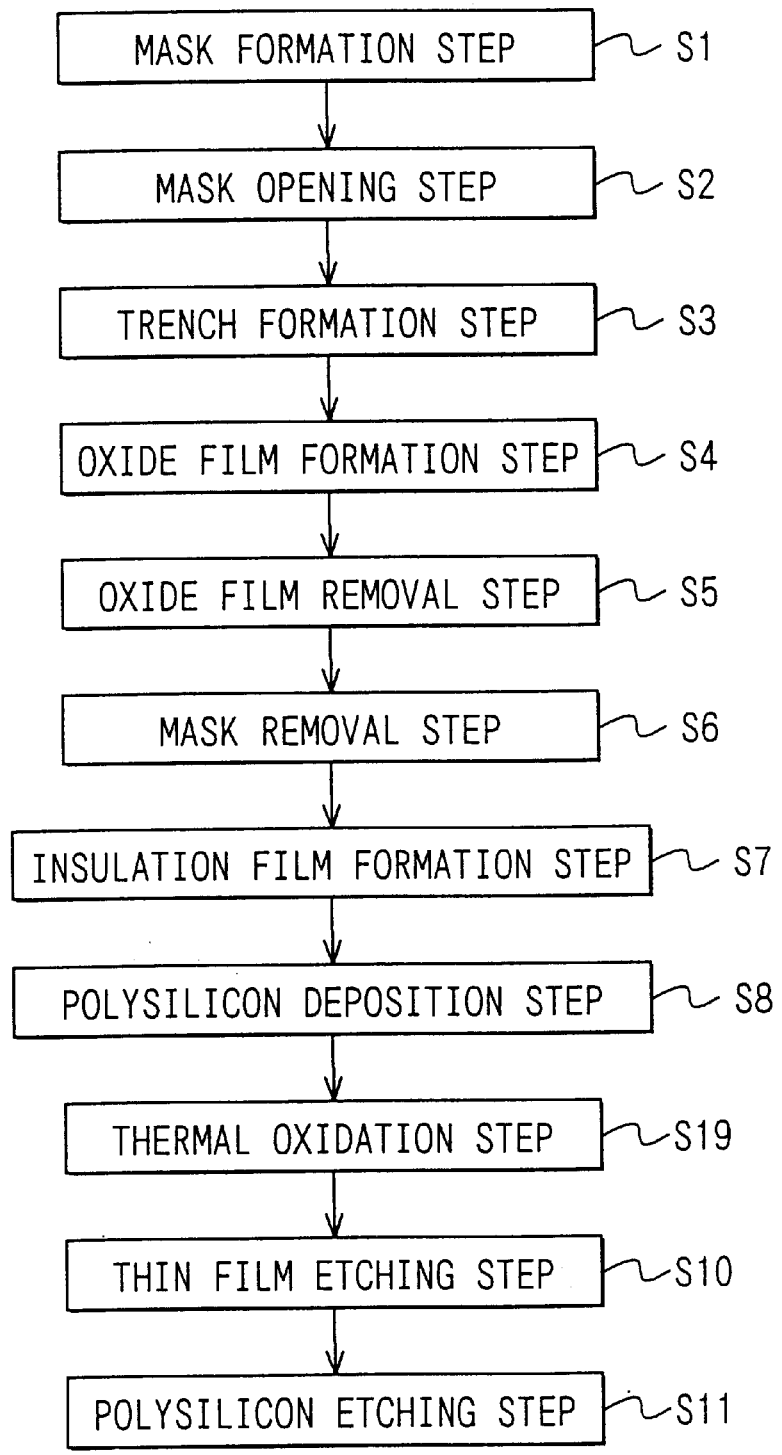
FIG. 14A is a flowchart showing a method for manufacturing a semiconductor device according to a second embodiment of the present invention.
Figure 14B:
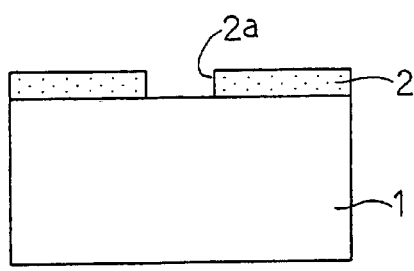
FIGS. 14B to 14I are cross-sectional views showing the semiconductor device at several steps shown in FIG. 14A.

FIG. 14A is a flowchart showing the manufacturing method according to the second embodiment in a stepwise manner. In FIG. 14A, the steps from the mask formation step S1 to the polysilicon deposition step S8 (FIGS. 14B to 14F) are performed substantially in the same manner as that of the first embodiment.

Figure 14F:
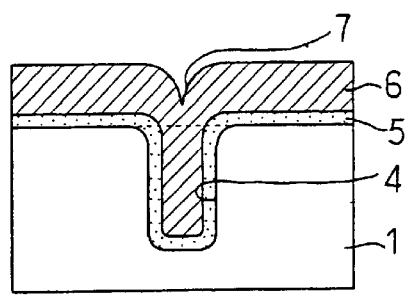
Figure 14C:
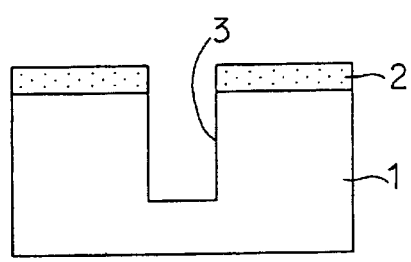
Figure 14G:
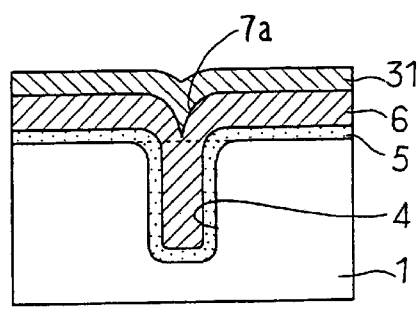
Figure 14D:
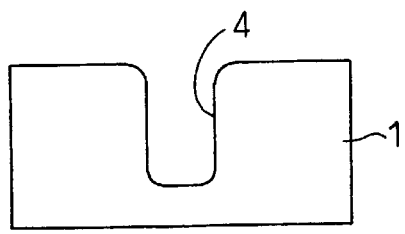
Figure 14H:
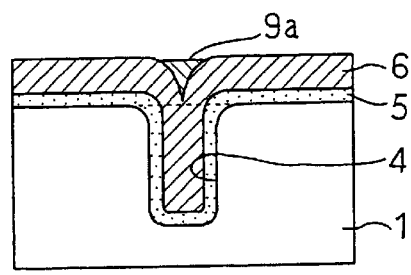
Figure 14E:
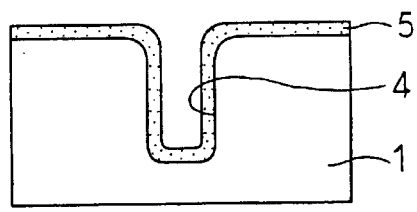
Figure 14I:
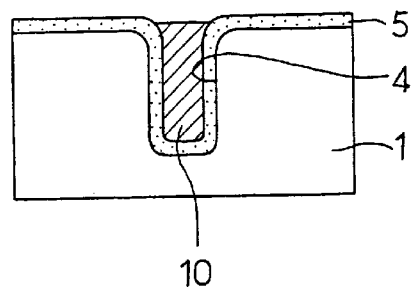

However, at the polysilicon deposition step S8 shown in FIG. 14F, preferably, the polysilicon film 6 is deposited to have a thickness thicker than that in the first embodiment. This is because, when the polysilicon film 6 is thermal oxidized at the following thermal oxidation step S19, a depression 7a shown in FIG. 14G, which is formed on a surface of the polysilicon film 6 (remaining without being oxidized) corresponding to the center of the trench 4, can have a bottom, a position of which is approximately coplanar with or higher than the surface of the semiconductor substrate 1.

Then, at the thermal oxidation step S19, a heat treatment is performed to the polysilicon film 6 at a predetermined temperature, so that a thermal oxide film 31 is formed on the surface. The thermal oxide film 31 has etching selectivity with respect to polysilicon when the polysilicon film 6 is etched.

Next, at the thin film etching step S10, the thermal oxide film 31 is anisotropically etched so that a portion of the thermal oxide film 31 remains in the depression 7a as a remaining portion. The remaining portion functions as a self-aligning mask 9a at the following polysilicon etching step S11.

At the polysilicon etching step S11, the polysilicon film 6 is isotropically etched by a wet treatment using a mixed solution of, for example, hydrofluoric acid:nitric acid=

1:50–300, more preferably, hydrofluoric acid:nitric acid= 1:100, so as not to damage the entire area of the substrate surface including the surface portion of the trench 4. Finally, the polysilicon embedded layer 10 embedded in the trench 4 is obtained.

According to the manufacturing method as described above, the polysilicon embedded layer 10 can be provided with sufficient flatness and high reliability, and the same advantages as those in the first embodiment can be attained.

Third Embodiment

FIGS. 15A through 15H show a manufacturing method in a third embodiment, and only portions different from those of the first embodiment are explained below.

Figure 15A:
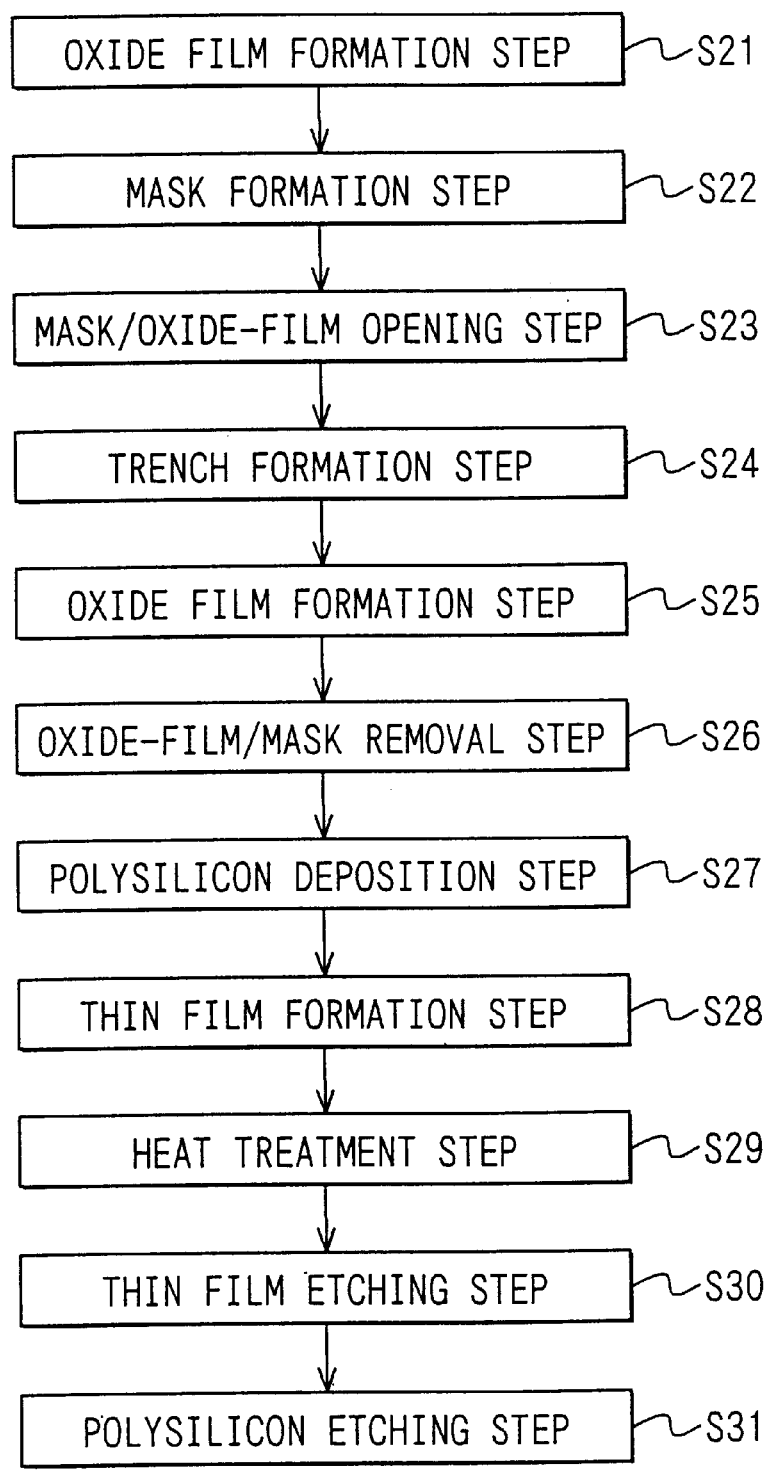
FIG. 15A is a flowchart showing a method for manufacturing a semiconductor device according to a third embodiment of the present invention.
Figure 15B:
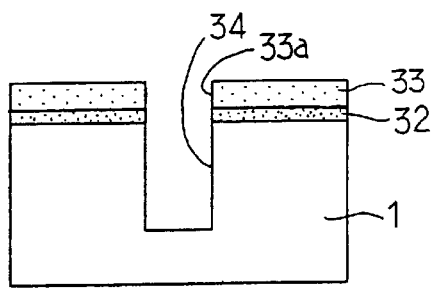
FIGS. 15B to 15H are cross-sectional views showing the semiconductor device at several steps shown in FIG. 15A.

FIG. 15A is a flowchart showing the manufacturing method according to the third embodiment in a stepwise manner. In FIG. 15A, after an oxide film formation step S21 for forming an oxide film 32 on the surface of the semiconductor substrate 1, a mask formation step S22 for forming a mask 33 and a mask/oxide-film opening step S23 for patterning both the mask 33 and the oxide film 32 to form an opening 33a are successively performed. Further, at a trench formation step S24, as shown in FIG. 15B, anisotropic etching is performed in a thickness direction of the semiconductor substrate 1 through the opening 33a of the mask 33 to thereby form a trench 34.

Next, residues produced inside the trench 34 during the anisotropic etching are removed by diluted hydrofluoric acid solution. After that, at a thermal oxide film (sacrificial oxide film) formation step S25, a thermal oxide film (sacrificial oxide film) having a thickness of about 100 nm is deposited in dry oxygen atmosphere at, for example, oxidization temperature of 1100° C. on purpose to improve the shape of the trench 34 and to remove an etching damage layer and the like from the surface of the semiconductor substrate 1. Further, at a thermal oxide film/mask removal step S26, the thermal oxide film and the mask 33 are removed by diluted hydrofluoric acid solution. Accordingly, as shown in FIG. 15C, the trench 35 is provided with a smooth shape in state where the etching damage layer is reduced.

Figure 15E:
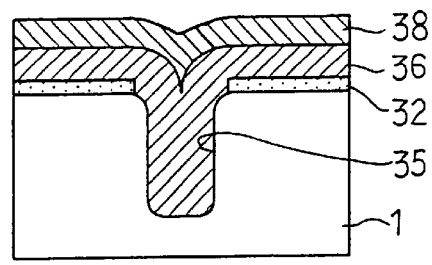
Figure 15C:
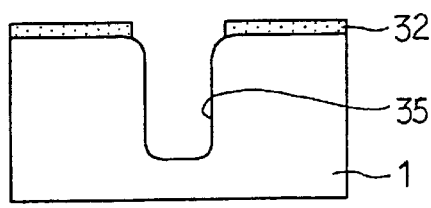
Figure 15F:
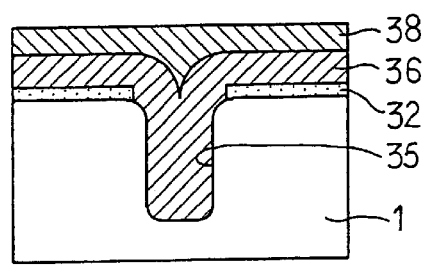
Figure 15D:
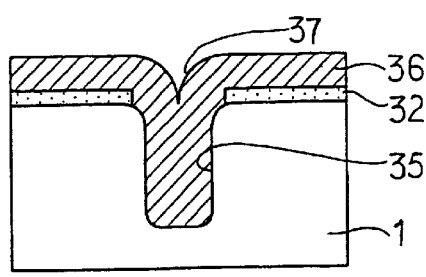

Then, at a polysilicon deposition step S27, as shown in FIG. 15D, a polysilicon film 36 is deposited on the surface of the semiconductor substrate 1 by, for example, a CVD apparatus, thereby filling the inside of the trench 35 with polysilicon. The polysilicon film 36 is formed at this step to have a depression 37 at a surface portion thereof corresponding to approximately a center of the trench 35. The thickness of the polysilicon film 36 is controlled so that the depression 37 has a bottom portion, a position of which is approximately coplanar with or preferably higher than the surface of the semiconductor substrate 1.

After that, as shown in FIG. 15E, a selective thin film 38 is formed on the polysilicon film 36 at a thin film formation step S28. The selective thin film 38 is composed of, for example, a BPSG film, and has selectivity with respect to polysilicon when the polysilicon film 36 is etched. Next, at a heat treatment step S29 shown in FIG. 15F, a heat treatment is carried out at 950° C. for about 20 minutes. Accordingly, the polysilicon inside the trench 35 is densified, and at the same time, the selective thin film 38 is flattened by the reflow.

Figure 15G:
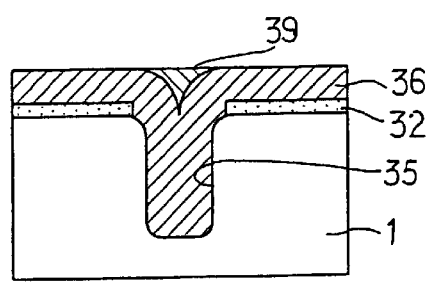
Figure 15H:
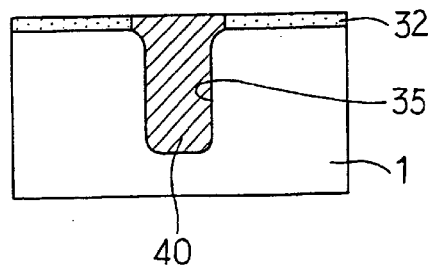

Further, at a thin film etching step S30, the selective thin film 38 is etched to remain only in the depression 37 as a remaining portion as shown in FIG. 15G. The remaining portion works as a self-aligning mask 39 at the following polysilicon etching step S31.

At the polysilicon etching step S31, the polysilicon film 36 is isotropically etched by a wet treatment using a mixed solution of, for example, hydrofluoric acid:nitric acid= 1:50–300, more preferably, hydrofluoric acid:nitric acid= 1:100, so as not to damage the entire area of the substrate surface including the surface portion of the trench 35. Finally, a polysilicon embedded layer 40 embedded in the trench 35 is obtained.

According to the manufacturing method as described above, the polysilicon embedded layer 40 can be provided with sufficient flatness and high reliability. The polysilicon embedded layer 40 can be used as a polysilicon plug for a small-current element such as a memory device.

In the third embodiment, although the selective thin film 38 is composed of a BPSG film, it may be composed of a CVD oxide film formed from TEOS as a source material. Also, in the third embodiment, as in the second embodiment, a thermal oxide film may be formed, by thermal oxidation, on the surface of the polysilicon film to be used as a thin film in place of the selective thin film 38.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, the selective thin film having an etching selectivity with respect to the polysilicon film;

etching back the selective thin film for removing the selective thin film, except for a remaining portion of the selective thin film that is located in the depression;

etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film; and densifying the polysilicon film by a heat treatment, after the polysilicon film is formed and before the selective thin film is formed.

2. The method according to claim 1, further comprising:

forming an insulation film on an inner wall surface of the trench before the polysilicon film is formed.

3. The method according to claim 1, wherein the selective thin film is anisotropically etched during the etching back of the selective thin film.

4. The method according to claim 1, wherein:

the polysilicon film is formed to have a thickness so that the bottom of the depression is approximately at the level of or higher than the main surface of the semiconductor substrate.

5. The method according to claim 1, wherein the polysilicon film is isotropically etched during the etching back of the polysilicon film.

6. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, the selective thin film having an etching selectivity with respect to the polysilicon film;

etching back the selective thin film for removing the selective thin film, except for a remaining portion of the selective thin film that is located in the depression;

etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film; and densifying the polysilicon film and the selective thin film by a heat treatment after the selective thin film is formed, and before the selective thin film is etched.

7. The method according to claim 6, further comprising:

forming an insulation film on an inner wall surface of the trench before the polysilicon film is formed.

8. The method according to claim 6, wherein the selective thin film is anisotropically etched during the etching back of the selective thin film.

9. The method according to claim 6, wherein:

the polysilicon film is formed to have a thickness so that the bottom of the depression is approximately at the level of or higher than the main surface of the semiconductor substrate.

10. The method according to claim 6, wherein the polysilicon film is isotropically etched during the etching back of the polysilicon film.

11. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, wherein the selective thin film is CVD oxide film formed from TEOS (Tetra Ethyl Ortho-Silicate) and has an etching selectivity with respect to the polysilicon film;

etching back the selective thin film for removing the selective thin film, except for a remaining portion of the selective thin film that is located in the depression; and etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film.

12. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, wherein the selective thin film is a CVD oxide film containing at least one of phosphorus and boron and the selective thin film has an etching selectivity with respect to the polysilicon film;

etching back the selective thin film for removing the selective thin film, except for a remaining portion of the selective thin film that is located in the depression; and etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film.

13. The method according to claim 12, further comprising:

forming an insulation film on an inner wall surface of the trench before the polysilicon film is formed.

14. The method according to claim 12, wherein the selective thin film is Zanisotropically etched during the etching back of the selective thin film.

15. The method according to claim 12, wherein:

the polysilicon film is formed to have a thickness so that the bottom of the depression is approximately at the level of or higher than the main surface of the semiconductor substrate.

16. The method according to claim 12, wherein the polysilicon film is isotropically etched during the etching back of the polysilicon film.

17. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, the selective thin film having an etching selectivity with respect to the polysilicon film;

etching back the selective thin film for removing the selective thin film, except for a remaining portion of the selective thin film that is located in the depression;

etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film;

forming a sacrificial oxide film on the semiconductor substrate including an inner wall surface of the trench; and removing the sacrificial oxide film, before the polysilicon film is formed.

18. The method according to claim 17, further comprising:

forming an insulation film on an inner wall surface of the trench before the polysilicon film is formed.

19. The method according to claim 17, wherein the selective thin film is anisotropically etched during the etching back of the selective thin film.

20. The method according to claim 17, wherein:

the polysilicon film is formed to have a thickness so that the bottom of the depression is approximately at the level of or higher than the main surface of the semiconductor substrate.

21. The method according to claim 17, wherein the polysilicon film is isotropically etched during the etching back of the polysilicon film.

22. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

forming a selective thin film on the polysilicon film for filling the depression with the selective thin film, the selective thin film having an etching selectivity with respect to the polysilicon film;

etching back the selective thin film for removing the selective thin film, except for a remaining portion of the selective thin film that is located in the depression;

etching back the polysilicon film for removing the remaining portion of the selective thin film and the polysilicon film, except for the polysilicon film that fills the trench, wherein the portion of the selective thin film that is located in the depression serves as a mask during the etching back of the polysilicon film, wherein:

the polysilicon film is isotropically etched during the etching back of the polysilicon film; and the isotropically etching of the polysilicon film is a wet treatment.

23. The method according to claim 22, wherein the isotropic etching is performed in a mixed solution containing hydrofluoric acid and nitric acid.

24. The method according to claim 23, wherein the mixed solution has a ratio of hydrofluoric acid:nitric acid being in a range of 1:50 to 1:300.

25. The method according to claim 24, wherein the ratio of hydrofluoric acid:nitric acid in the mixed solution is 1:100.

26. The method according to claim 22, further comprising:

forming an insulation film on an inner wall surface of the trench before the polysilicon film is formed.

27. The method according to claim 22, wherein the selective thin film is anisotropically etched during the etching back of the selective thin film.

28. The method according to claim 22, wherein:

the polysilicon film is formed to have a thickness so that the bottom of the depression is approximately at the level of or higher than the main surface of the semiconductor substrate.

29. A method for manufacturing a semiconductor device, comprising:

forming a trench on a main surface of a semiconductor substrate by anisotropic etching;

forming a polysilicon film on the main surface for filling the trench and for forming a depression in the polysilicon film above the trench;

heat treating the polysilicon film for forming a thermal oxide film on a surface of the polysilicon film and for filling the depression with the thermal oxide film;

etching back the thermal oxide film for removing the thermal oxide film, except for a remaining portion of the thermal oxide film that is located in the depression; and etching back the polysilicon film and removing the remaining portion of the thermal oxide film for removing the polysilicon film, except for the polysilicon film that fills the trench, wherein the portion of the thermal oxide film that is located in the depression serves as a mask during the etching back of the polysilicon film.

30. The method according to claim 29, further comprising:

forming an insulation film on an inner wall surface of the trench before the trench is filled with the polysilicon film.

31. The method according to claim 29, wherein the thermal oxide film is anisotropically etched during the etching back of the thermal oxide film.

32. The method according to claim 29, further comprising:

forming a sacrificial oxide film on the semiconductor substrate including an inner wall surface of the trench; and removing the sacrificial oxide film, before the polysilicon film is formed.

33. The method according to claim 29, wherein:

the polysilicon film is formed to have a thickness so that the bottom of the depression is approximately at the level of or higher than the main surface of the semiconductor substrate.

34. The method according to claim 29, wherein the polysilicon film is isotropically etched during the etching back of the polysilicon film.

35. The method according to claim 34, wherein the isotropic etching of the polysilicon film is a wet treatment.

36. The method according to claim 35, wherein the isotropic etching is performed in a mixed solution containing hydrofluoric acid and nitric acid.

37. The method according to claim 36, wherein the mixed solution has a ratio of hydrofluoric acid:nitric acid being in a range of 1:50 to 1:300.

38. The method according to claim 37, wherein the of hydrofluoric acid:nitric acid in the mixed solution is 1:100.

39. A method for manufacturing a semiconductor device, comprising:

forming a trench on a main surface of a semiconductor substrate;

forming a polysilicon film on the main surface of the semiconductor substrate and inside the trench for forming a depression in the polysilicon film above the trench;

forming a selective thin film on the polysilicon film for filling the depression with the selective thin film, wherein the selective thin film is an oxide film;

removing the selective thin film except for a remaining portion of the selective thin film that is located in the depression; and etching the polysilicon film and the remaining portion of the selective thin film for removing the polysilicon film and the remaining portion, except for a portion of the polysilicon that fills the trench, and for flattening a surface of the polysilicon film above the trench, wherein the portion of the selective thin film that is located in the depression serves as a mask during the etching the polysilicon film.

* * * * *